United States Patent
Lai et al.

(10) Patent No.: US 12,274,087 B2
(45) Date of Patent: Apr. 8, 2025

(54) FIELD EFFECT TRANSISTOR AND FABRICATION METHOD THEREOF

(71) Applicant: UNITED MICROELECTRONICS CORP., Hsin-Chu (TW)

(72) Inventors: Kuo-Chih Lai, Tainan (TW); Shih-Min Chou, Tainan (TW); Nien-Ting Ho, Tainan (TW); Wei-Ming Hsiao, Tainan (TW); Li-Han Chen, Tainan (TW); Szu-Yao Yu, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 366 days.

(21) Appl. No.: 17/990,763

(22) Filed: Nov. 21, 2022

(65) Prior Publication Data

US 2024/0128324 A1    Apr. 18, 2024

(30) Foreign Application Priority Data

Oct. 18, 2022 (CN) .......................... 202211272106.8

(51) Int. Cl.
| | |
|---|---|
| *H10D 62/80* | (2025.01) |
| *H10D 30/01* | (2025.01) |
| *H10D 30/60* | (2025.01) |
| *H10D 62/13* | (2025.01) |
| *H10D 62/17* | (2025.01) |
| *H10D 62/83* | (2025.01) |
| *H10D 64/27* | (2025.01) |

(52) U.S. Cl.
CPC .......... *H10D 62/882* (2025.01); *H10D 30/01* (2025.01); *H10D 30/60* (2025.01); *H10D 62/151* (2025.01); *H10D 62/235* (2025.01); *H10D 62/8303* (2025.01); *H10D 64/513* (2025.01)

(58) Field of Classification Search
CPC .......................... H10D 62/882; H10D 64/513
See application file for complete search history.

(56) References Cited

U.S. PATENT DOCUMENTS

| | | | | |
|---|---|---|---|---|
| 7,732,859 | B2 | 6/2010 | Anderson | |
| 9,076,873 | B2 | 7/2015 | Chen | |
| 11,569,367 | B1* | 1/2023 | Son | H10D 62/8303 |
| 2007/0018199 | A1* | 1/2007 | Sheppard | H10D 30/015 257/E29.127 |
| 2024/0014287 | A1* | 1/2024 | Lee | H10D 64/513 |

* cited by examiner

*Primary Examiner* — Wasiul Haider
(74) *Attorney, Agent, or Firm* — Winston Hsu

(57) ABSTRACT

A field effect transistor includes a substrate having a transistor forming region thereon; an insulating layer on the substrate; a first graphene layer on the insulating layer within the transistor forming region; an etch stop layer on the first graphene layer within the transistor forming region; a first inter-layer dielectric layer on the etch stop layer; a gate trench recessed into the first inter-layer dielectric layer and the etch stop layer within the transistor forming region; a second graphene layer on interior surface of the gate trench; a gate dielectric layer on the second graphene layer and on the first inter-layer dielectric layer; and a gate electrode on the gate dielectric layer within the gate trench.

20 Claims, 13 Drawing Sheets

FIELD EFFECT TRANSISTOR AND FABRICATION METHOD THEREOF

BACKGROUND OF THE INVENTION

1. Field of the Invention

The invention relates to the field of semiconductor technology, in particular to a graphene field-effect-transistor and a manufacturing method thereof.

2. Description of the Prior Art

Graphene has excellent electronic properties. For example, the electron carriers in graphene exhibit very high mobility. Therefore, many studies have employed graphene as channel material for the next-generation transistor devices.

However, the band gap of the existing graphene field-effect-transistor cannot be adjusted. In addition, a catalyst is required in the process of fabricating the graphene field-effect-transistor, and when the catalyst is removed, the graphene layer is easily damaged.

SUMMARY OF THE INVENTION

It is one object of the present invention to provide an improved graphene channel transistor and a manufacturing method thereof to solve the deficiencies or shortcomings of the prior art.

One aspect of the invention provides a field effect transistor including a substrate having a transistor forming region thereon; an insulating layer on the substrate; a first graphene layer on the insulating layer within the transistor forming region; an etch stop layer on the first graphene layer within the transistor forming region; a first inter-layer dielectric layer on the etch stop layer; a gate trench recessed into the first inter-layer dielectric layer and the etch stop layer within the transistor forming region; a second graphene layer on interior surface of the gate trench; a gate dielectric layer on the second graphene layer and on the first inter-layer dielectric layer; and a gate electrode on the gate dielectric layer within the gate trench.

According to some embodiments, the second graphene layer is in direct contact with the first graphene layer within the gate trench.

According to some embodiments, the insulating layer comprises a silicon oxide layer.

According to some embodiments, the etch stop layer comprises a silicon nitride layer.

According to some embodiments, the field effect transistor further includes a source metal layer embedded in the first inter-layer dielectric layer and the etch stop layer, on a side of the gate electrode; and a drain metal layer embedded in the first inter-layer dielectric layer and the etch stop layer, on an opposite side of the gate electrode, wherein the source metal layer and the drain metal layer are in direct contact with the first graphene layer.

According to some embodiments, the field effect transistor further includes a second inter-layer dielectric layer covering the gate dielectric layer, the gate electrode, the source metal layer, and the drain metal layer.

According to some embodiments, the field effect transistor further includes a gate contact embedded in the second inter-layer dielectric layer and in direct contact with the gate electrode; a source contact embedded in the second inter-layer dielectric layer and in direct contact with the source metal layer; and a drain contact embedded in the second inter-layer dielectric layer and in direct contact with the drain metal layer.

According to some embodiments, the gate dielectric layer is in direct contact with the second inter-layer dielectric layer.

According to some embodiments, the gate dielectric layer is in direct contact with the first inter-layer dielectric layer.

According to some embodiments, the first graphene layer comprises single-layer graphene, and the second graphene layer comprises single-layer or double-layer graphene.

Another aspect of the invention provides a method for fabricating a field effect transistor including the steps of providing a substrate having a transistor forming region thereon; forming an insulating layer on the substrate; forming a first graphene layer on the insulating layer within the transistor forming region; forming an etch stop layer on the first graphene layer within the transistor forming region; forming a first inter-layer dielectric layer on the etch stop layer; forming a gate trench recessed into the first inter-layer dielectric layer and the etch stop layer within the transistor forming region; forming a second graphene layer on interior surface of the gate trench; forming a gate dielectric layer on the second graphene layer and on the first inter-layer dielectric layer; and forming a gate electrode on the gate dielectric layer within the gate trench.

According to some embodiments, the second graphene layer is in direct contact with the first graphene layer within the gate trench.

According to some embodiments, the insulating layer comprises a silicon oxide layer.

According to some embodiments, the etch stop layer comprises a silicon nitride layer.

According to some embodiments, the method further includes the step of forming a source metal layer in the first inter-layer dielectric layer and the etch stop layer, on a side of the gate electrode; and forming a drain metal layer in the first inter-layer dielectric layer and the etch stop layer, on an opposite side of the gate electrode, wherein the source metal layer and the drain metal layer are in direct contact with the first graphene layer.

According to some embodiments, the method further includes the step of forming a second inter-layer dielectric layer covering the gate dielectric layer, the gate electrode, the source metal layer, and the drain metal layer.

According to some embodiments, the method further includes the step of forming a gate contact in the second inter-layer dielectric layer, wherein the gate contact is in direct contact with the gate electrode; forming a source contact in the second inter-layer dielectric layer, wherein the source contact is in direct contact with the source metal layer; and forming a drain contact in the second inter-layer dielectric layer, wherein the drain contact is in direct contact with the drain metal layer.

According to some embodiments, the gate dielectric layer is in direct contact with the second inter-layer dielectric layer.

According to some embodiments, the gate dielectric layer is in direct contact with the first inter-layer dielectric layer.

According to some embodiments, the first graphene layer comprises single-layer graphene, and the second graphene layer comprises single-layer or double-layer graphene.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
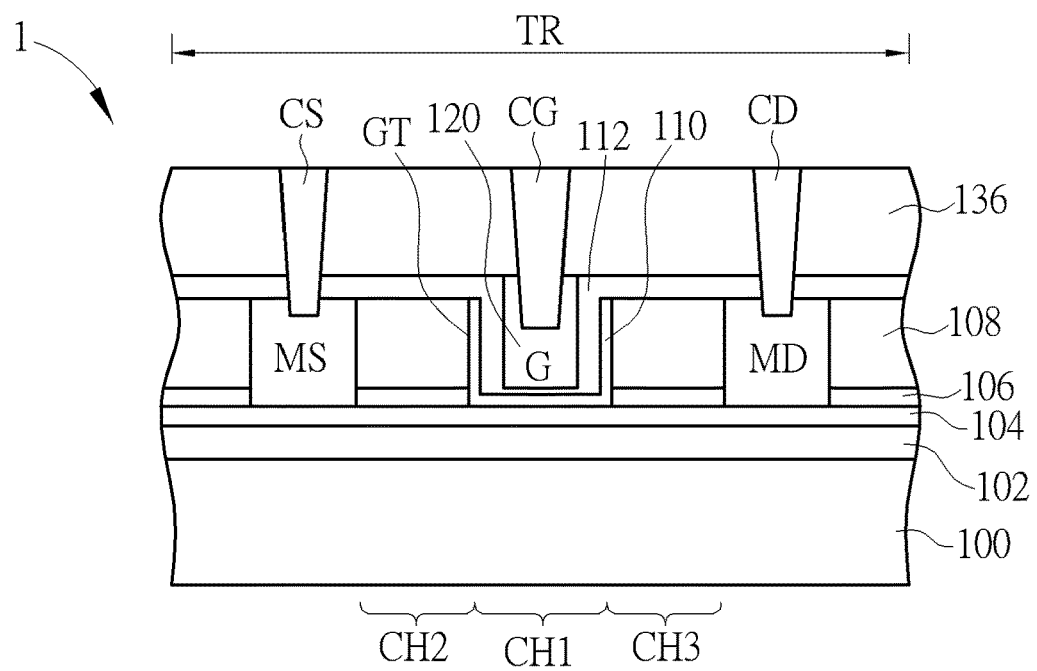
FIG. 1 is a schematic cross-sectional view of a graphene channel transistor according to an embodiment of the present invention.

Please refer to FIG. 1, which is a schematic cross-sectional view of a graphene channel transistor according to an embodiment of the present invention. As shown in FIG. 1, the graphene channel transistor 1 includes a substrate 100 having a transistor forming region TR thereon. An insulating layer 102 is provided on the substrate 100. According to an embodiment of the present invention, for example, the insulating layer 102 includes a silicon oxide layer.

According to an embodiment of the present invention, a first graphene layer 104 is formed on the insulating layer 102 in the transistor forming region TR. According to an embodiment of the present invention, an etch stop layer 106 is formed on the first graphene layer 104 in the transistor forming region TR. According to an embodiment of the present invention, the etch stop layer 106 includes a silicon nitride layer. According to an embodiment of the present invention, a first interlayer dielectric layer 108 is formed on the etch stop layer 106.

According to an embodiment of the present invention, a gate trench GT is formed in the first interlayer dielectric layer 108 and the etch stop layer 106 in the transistor forming region TR. According to an embodiment of the present invention, a second graphene layer 110 is formed on the inner surface of the gate trench GT. According to an embodiment of the present invention, a gate dielectric layer 112 is disposed on the second graphene layer 110 and the first interlayer dielectric layer 108. According to an embodiment of the present invention, a gate electrode 120 is disposed on the gate dielectric layer 112 in the gate trench GT.

According to an embodiment of the present invention, for example, the first graphene layer 104 may include single layer graphene, and the second graphene layer 110 may include single layer graphene or double layer graphene. According to an embodiment of the present invention, the second graphene layer 110 is in direct contact with the first graphene layer 104 within the gate trench GT. According to an embodiment of the present invention, the gate dielectric layer 112 is in direct contact with the first interlayer dielectric layer 108.

According to an embodiment of the present invention, the field effect transistor 1 further includes: a source metal layer MS embedded in the first interlayer dielectric layer 108 and the etch stop layer 106 on one side of the gate electrode 120, and a drain metal layer MD embedded in the first interlayer dielectric layer 108 and the etch stop layer 106 on the opposite side of the gate electrode 120. The source metal layer MS and the drain metal layer MD directly contact the first graphene layer 106.

According to an embodiment of the present invention, the graphene channel transistor 1 further includes: a second interlayer dielectric layer 136 covering the gate dielectric layer 112, the gate electrode 120, the source metal layer MS, and the drain metal layer MD. According to an embodiment of the present invention, the gate dielectric layer 112 is in direct contact with the second interlayer dielectric layer 136.

According to an embodiment of the present invention, the graphene channel transistor 1 further includes: a gate contact CG, embedded in the second interlayer dielectric layer 136 and in direct contact with the gate electrode 120; a source contact CS, embedded in the second interlayer dielectric layer 136 and in direct contact with the source metal layer MS; and a drain contact CD, embedded in the second interlayer dielectric layer 136 and in direct contact with the drain metal layer MD.

According to an embodiment of the present invention, since the first channel region CH1 under the gate electrode 120 comprises the first graphene layer 104 and the second graphene layer 110, the band gap can be adjusted. According to an embodiment of the present invention, the second channel region CH2 between the gate electrode 120 and the source metal layer MS and the third channel region CH3 between the gate electrode 120 and the drain metal layer MD have only the first graphene layer 104, thereby retaining the high mobility of single-layer graphene.

Figure 2:
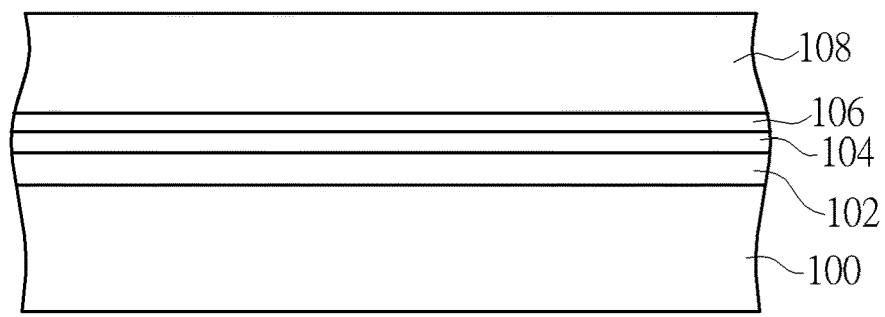
FIG. 2 to FIG. 14 are schematic diagrams illustrating a method for fabricating a graphene channel transistor according to an embodiment of the present invention.

Please refer to FIG. 2 to FIG. 14, which are schematic diagrams of a method for fabricating a graphene channel transistor according to an embodiment of the present invention, wherein like regions, layers or materials are designated by like numeral numbers or labels. As shown in FIG. 2, a substrate 100, for example, a P-type doped silicon substrate is provided. An insulating layer 102, a first graphene layer 104, an etch stop layer 106, and a first interlayer dielectric layer 108 are sequentially formed on the substrate 100.

According to an embodiment of the present invention, for example, the insulating layer 102 may include silicon oxide or hafnium oxide, but is not limited thereto. According to an embodiment of the present invention, for example, the etch stop layer 106 may comprise a silicon nitride layer. According to an embodiment of the present invention, for example, the first graphene layer 104 may include a single layer graphene. According to an embodiment of the present invention, for example, the first interlayer dielectric layer 108 may include silicon oxide, but is not limited thereto.

Figure 3:
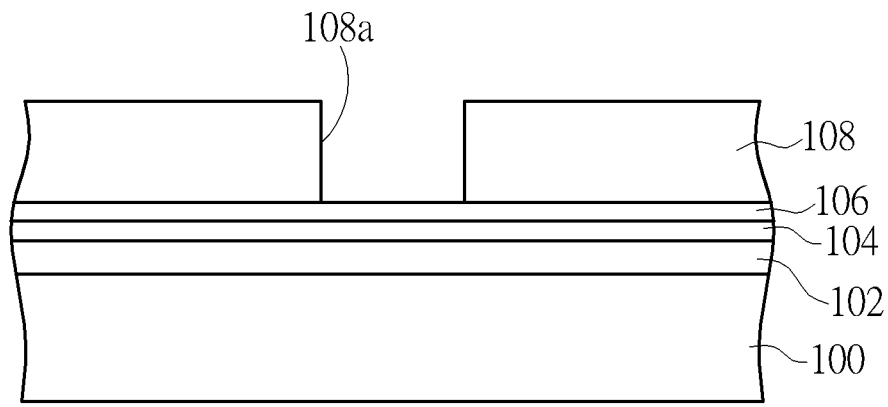

As shown in FIG. 3, next, a photolithography process and a dry etching process are performed to form an opening 108a in the first interlayer dielectric layer 108. According to an embodiment of the present invention, the opening 108a exposes a portion of the surface of the etch stop layer 106.

Figure 4:
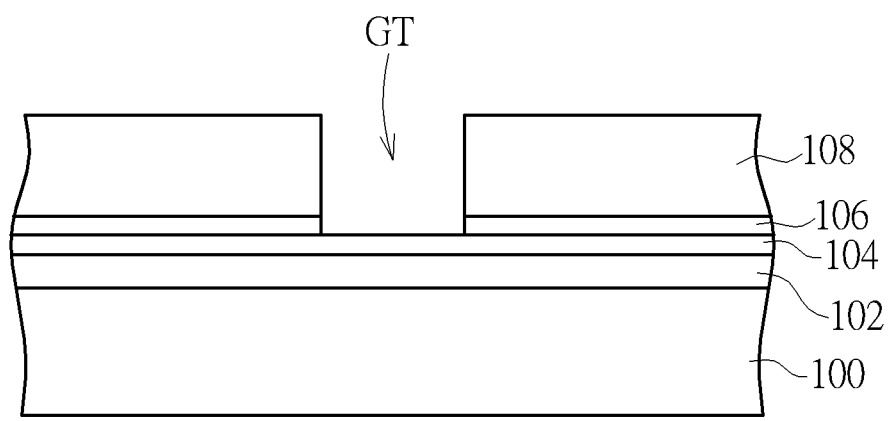

As shown in FIG. 4, next, a wet etching process is performed, and the exposed etching stop layer 106 is selectively etched away through the opening 108a, thereby forming a gate trench GT. According to an embodiment of the present invention, the gate trench GT exposes a part of the surface of the first graphene layer 104.

Figure 5:
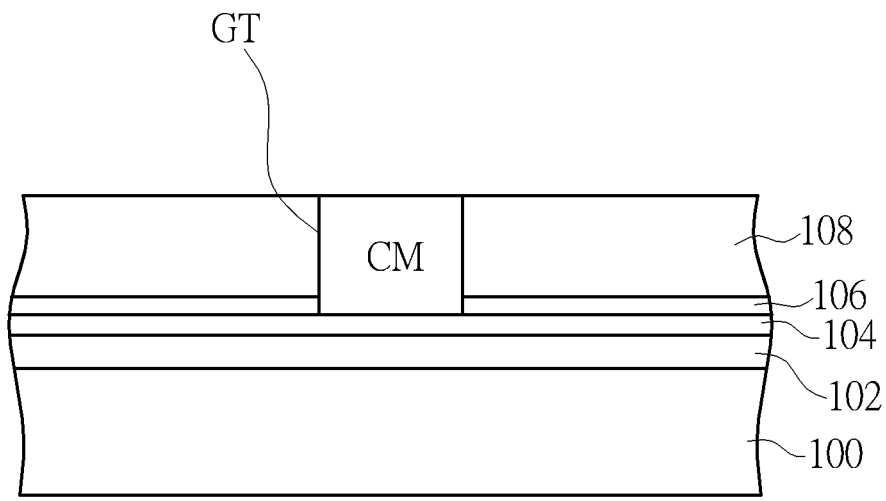

As shown in FIG. 5, next, a metal layer CM, such as nickel or copper, but not limited thereto, is deposited on the substrate 100. A planarization process, such as a chemical mechanical polishing process, is then performed to remove the metal layer CM deposited on the first interlayer dielectric layer 108. The remaining metal layer CM fills the gate trench GT.

Figure 6:
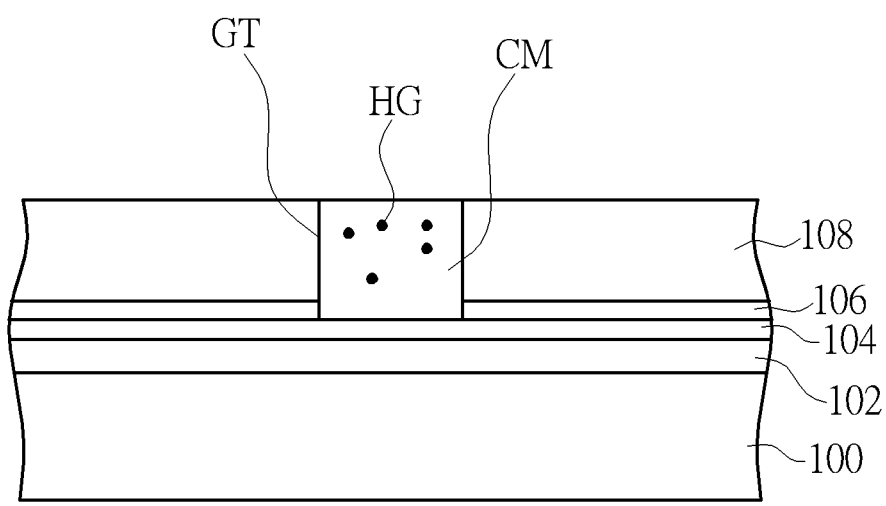

As shown in FIG. 6, the metal layer CM is brought into contact with a hydrocarbon gas HG, for example, acetylene, at a temperature of 700-1200 degrees Celsius, so that the hydrocarbon gas HG is dissolved into the metal layer CM.

Figure 7:
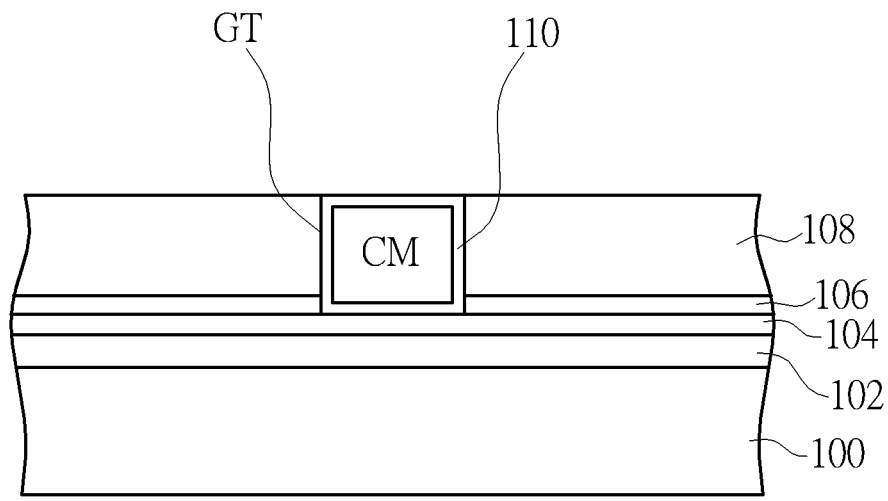

As shown in FIG. 7, next, a cooling process is performed to form the second graphene layer 110 on the surface of the metal layer CM. According to an embodiment of the present invention, the second graphene layer 110 may include single-layer or double-layer graphene. According to an embodiment of the present invention, the second graphene layer 110 is in direct contact with the first graphene layer 104 within the gate trench GT.

Figure 8:
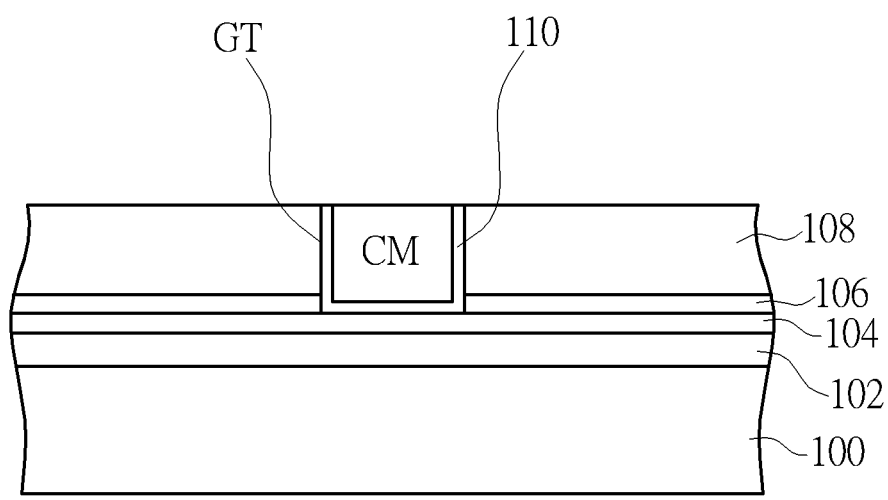

As shown in FIG. 8, next, a dry etching process, such as hydrogen plasma etching, is performed to remove the second graphene layer 110 exposed on the metal layer CM. At this point, the second graphene layer 110 in the gate trench GT presents a U-shaped profile.

Figure 9:
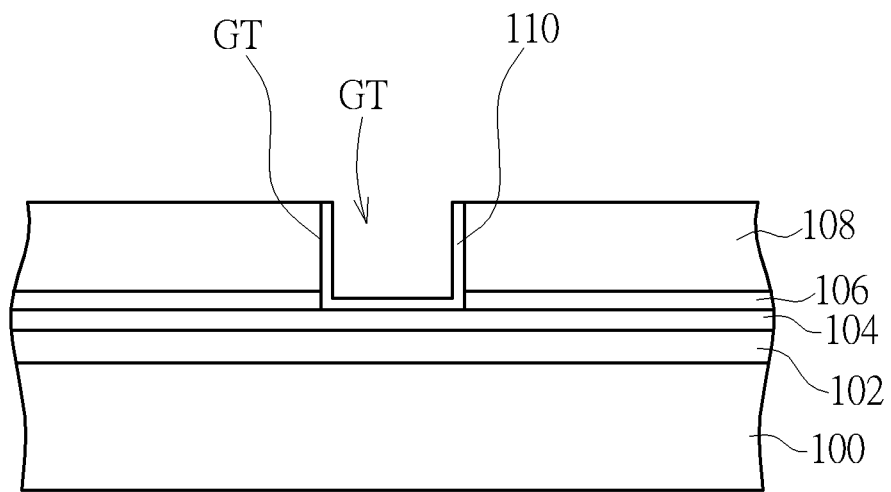

As shown in FIG. 9, a wet etching process using such as a hydrochloric acid solution, is used to completely remove the metal layer CM in the gate trench GT. Since the metal layer CM is removed by the wet etching process, the second graphene layer 110 will not be damaged.

Figure 10:
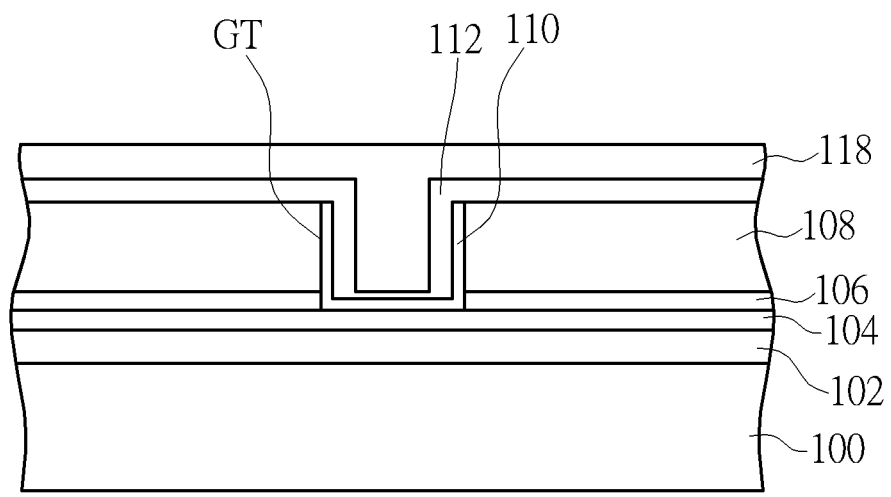

As shown in FIG. 10, a gate dielectric layer 112 is formed on the second graphene layer 110 and the first interlayer dielectric layer 108, and a gate metal layer 118 is then formed on the gate dielectric layer 112. According to an embodiment of the present invention, the gate dielectric layer 112 is in direct contact with the upper surface of the first interlayer dielectric layer 108.

Figure 11:
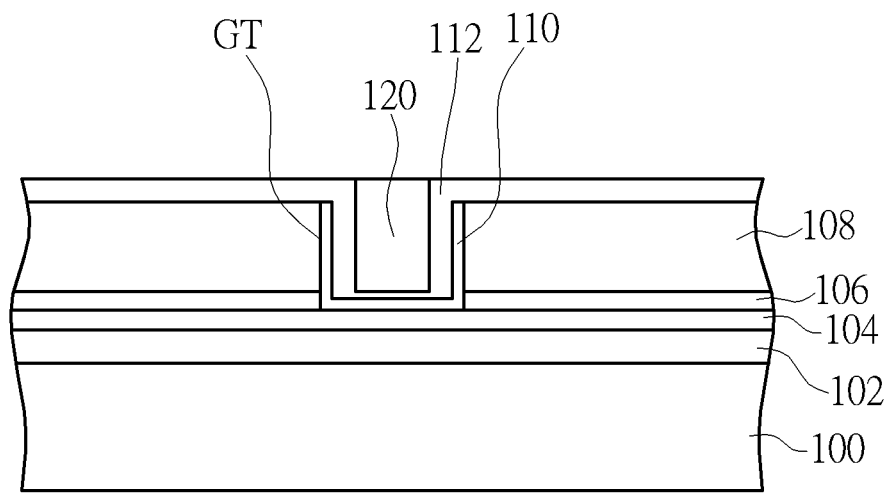

As shown in FIG. 11, next, a planarization process, such as a chemical mechanical polishing process, is performed to remove the gate metal layer 118 outside the gate trench GT, thereby forming the gate electrode 120 in the gate trench GT.

Figure 12:
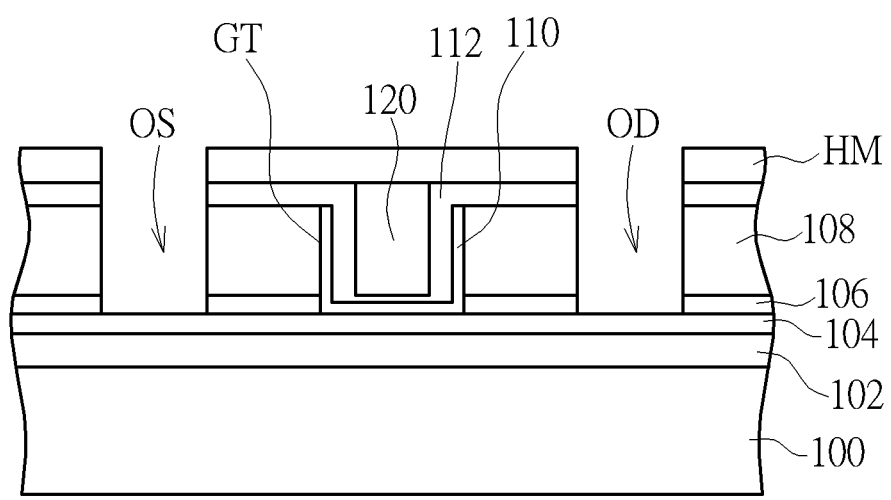

Next, as shown in FIG. 12, a hard mask HM, for example, a silicon nitride layer is deposited on the substrate 100. A photolithography process and a dry etching process are then performed to form source openings OS and drain openings OD in the hard mask HM, the gate dielectric layer 112 and the first interlayer dielectric layer 108.

Figure 13:
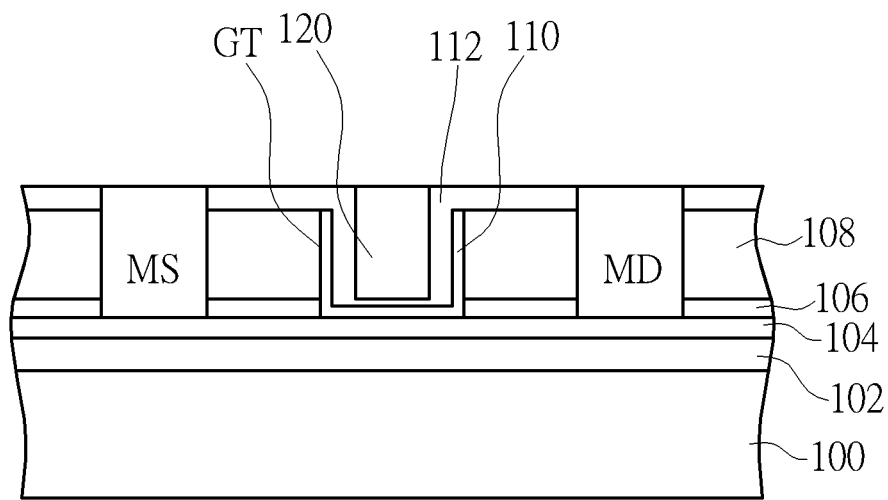

Subsequently, as shown in FIG. 13, the hard mask HM is selectively removed. A source metal layer MS and a drain metal layer MD are then formed in the source opening OS and the drain opening OD, respectively. For example, the method of forming the source metal layer MS and the drain metal layer MD may include depositing a metal layer in a blanket manner, and then performing a planarization process.

Figure 14:
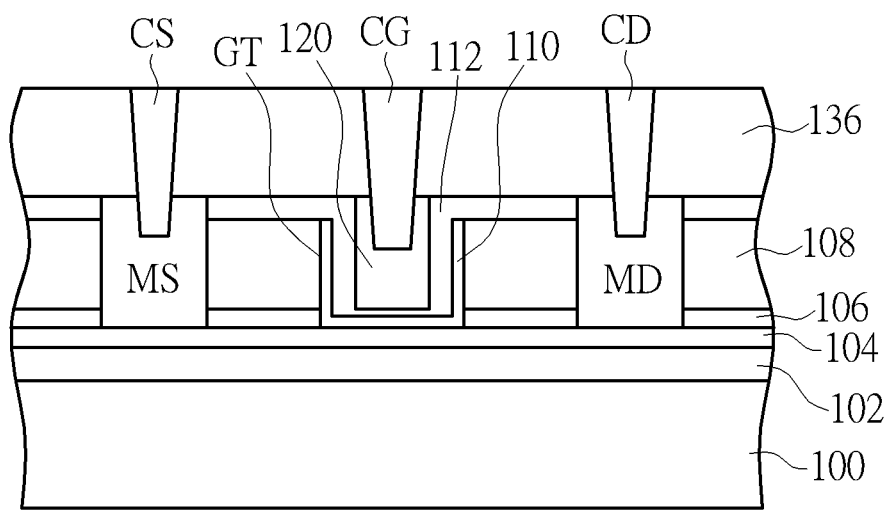

As shown in FIG. 14, a second interlayer dielectric layer 136 is deposited in a blanket manner. Subsequently, a gate contact CG in direct contact with the gate electrode 120, a source contact CS in direct contact with the source metal layer MS, and a drain contact CD in direct contact with the drain metal layer MD are formed in the second interlayer dielectric layer 136.

Figure 15:
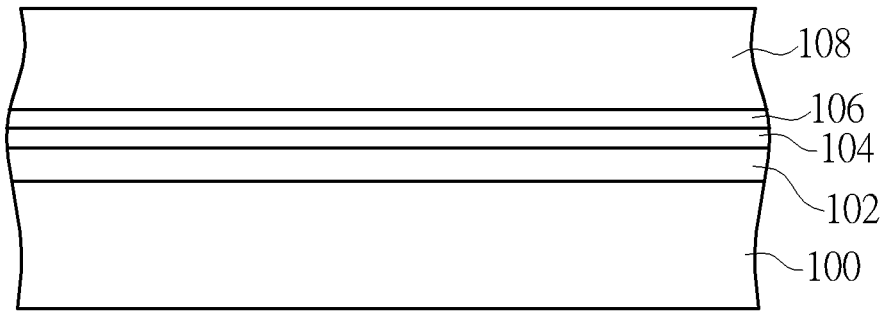
FIG. 15 to FIG. 26 are schematic diagrams illustrating a method for fabricating a graphene channel transistor according to another embodiment of the present invention.

Please refer to FIGS. 15 to 26, which are schematic diagrams of a method for fabricating a graphene channel transistor according to another embodiment of the present invention, wherein like regions, layers or materials are designated by like numeral numbers or labels. As shown in FIG. 15, a substrate 100, for example, a P-type doped silicon substrate is provided. An insulating layer 102, a first graphene layer 104, an etch stop layer 106, and a first interlayer dielectric layer 108 are sequentially formed on the substrate 100.

According to an embodiment of the present invention, for example, the insulating layer 102 may include silicon oxide or hafnium oxide, but is not limited thereto. According to embodiments of the present invention, for example, the etch stop layer 106 may comprise a silicon nitride layer. According to an embodiment of the present invention, for example, the first graphene layer 104 may include a single layer graphene. According to an embodiment of the present invention, for example, the first interlayer dielectric layer 108 may include silicon oxide, but is not limited thereto.

Figure 16:
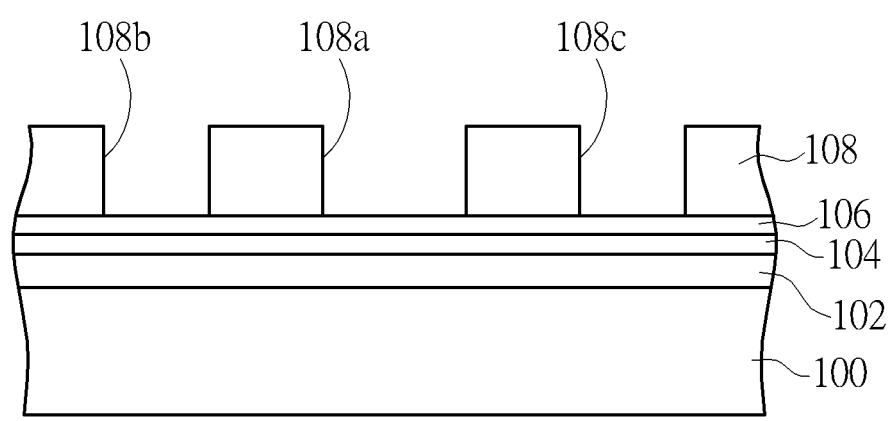

As shown in FIG. 16, next, a photolithography process and a dry etching process are performed to form openings 108a, 108b and 108c in the first interlayer dielectric layer 108. According to an embodiment of the present invention, the openings 108a, 108b and 108c expose portions of the surface of the etch stop layer 106, respectively.

Figure 17:
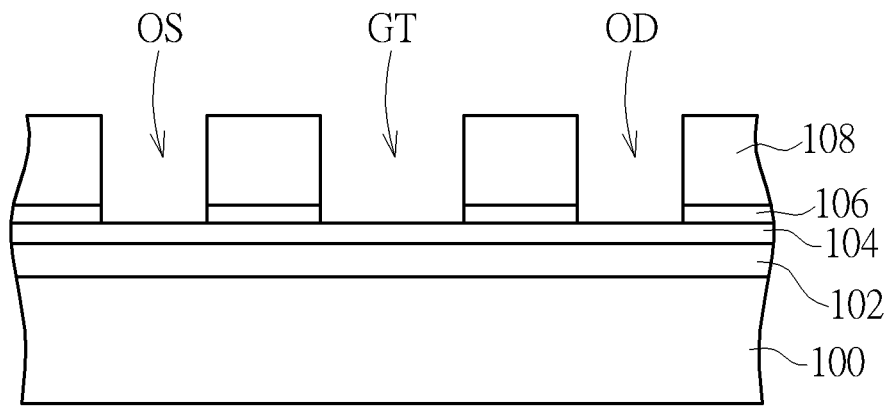

As shown in FIG. 17, a wet etching process is then performed to selectively etch away the exposed etching stop layer 106 through the openings 108a, 108b and 108c, thereby forming the gate trench GT, the source opening OS and the drain opening OD. According to an embodiment of the present invention, the gate trench GT, the source opening OS and the drain opening OD respectively expose part of the surface of the first graphene layer 104.

Figure 18:
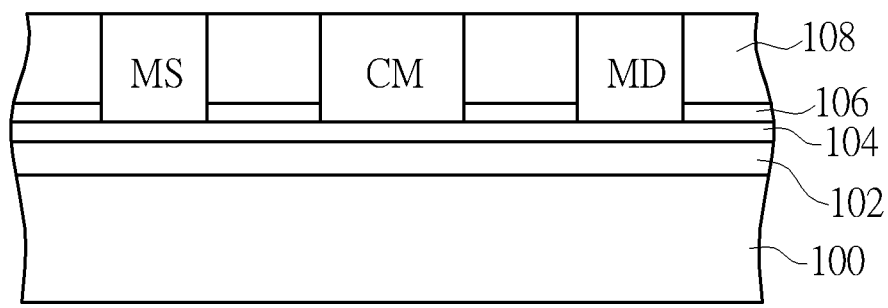

As shown in FIG. 18, a metal layer CM is then deposited on the substrate 100 so that the metal layer CM fills the gate trench GT, the source opening OS and the drain opening OD. A planarization process, such as a chemical mechanical polishing process, is then performed to remove the metal layer CM deposited on the first interlayer dielectric layer 108. The remaining metal layer CM fills the gate trench GT, source opening OS and the drain opening OD, thereby forming a source metal layer MS and a drain metal layer MD in the source opening OS and the drain opening OD, respectively.

Figure 19:
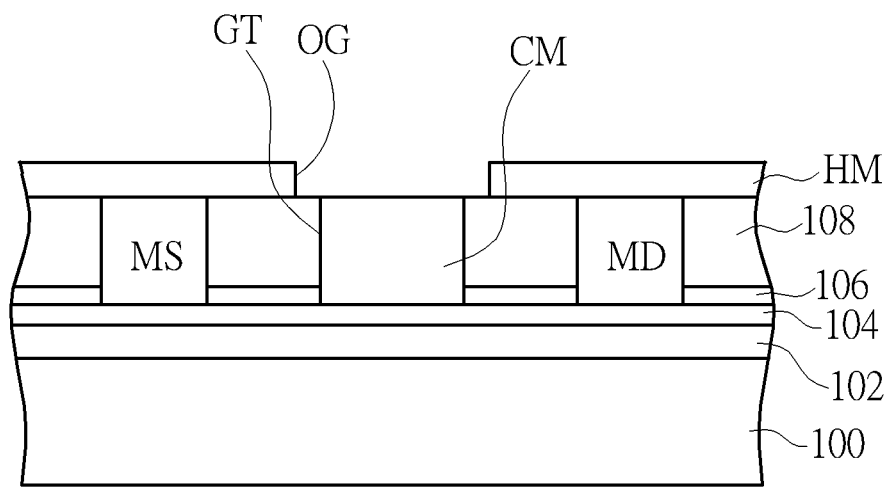
Figure 20:
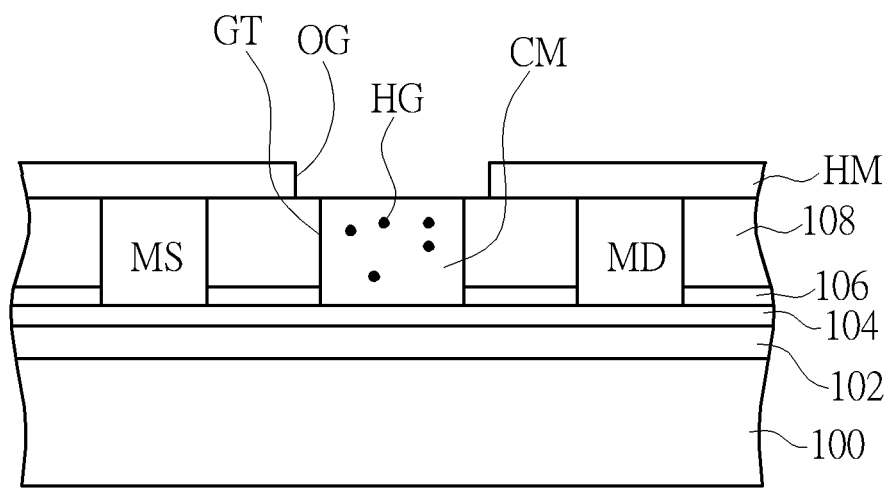

As shown in FIG. 19, a hard mask HM, for example, a silicon nitride layer is deposited on the substrate 100. A photolithography process and a dry etching process are then performed to form an opening OG in the hard mask HM. According to an embodiment of the present invention, at this point, the hard mask HM covers the source metal layer MS and the drain metal layer MD, so that the opening OG of the hard mask HM exposes the metal layer CM in the gate trench GT. As shown in FIG. 20, the metal layer CM is brought into contact with a hydrocarbon gas HG, for example, acetylene, at a temperature of 700-1200 degrees Celsius, so that the hydrocarbon gas HG is dissolved into the metal layer CM.

Figure 21:
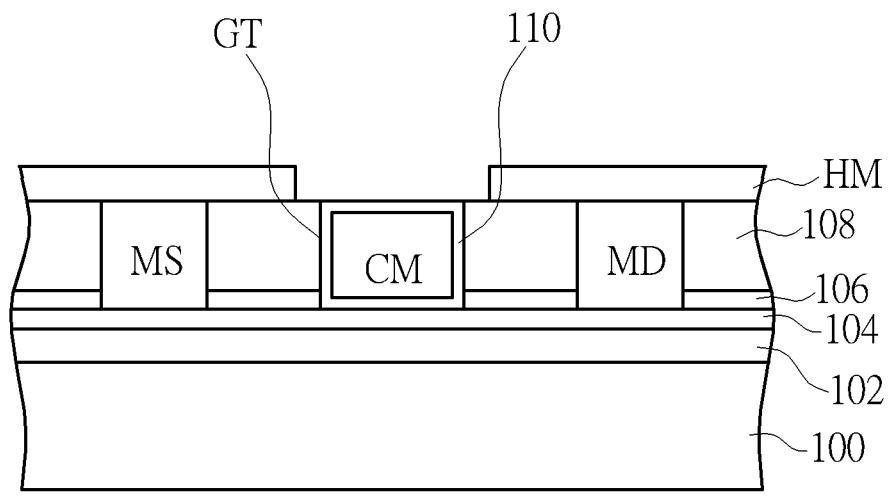

As shown in FIG. 21, next, a cooling process is performed to form the second graphene layer 110 on the surface of the metal layer CM. According to an embodiment of the present invention, the second graphene layer 110 may include single-layer or double-layer graphene. According to an embodiment of the present invention, the second graphene layer 110 at the bottom of the metal layer CM is in direct contact with the first graphene layer 104 in the gate trench GT.

Figure 22:
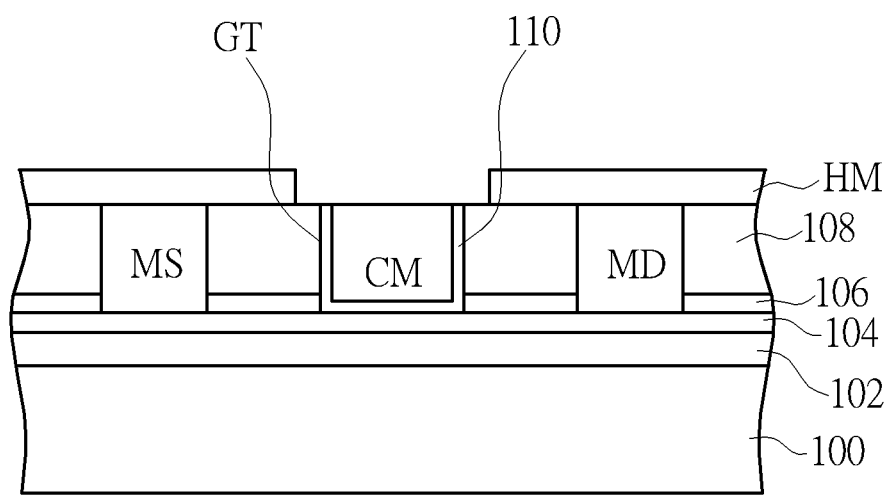

As shown in FIG. 22, next, a dry etching process, such as hydrogen plasma etching, is performed to remove the second graphene layer 110 exposed on the top surface of the metal layer CM. At this point, the second graphene layer 110 in the gate trench GT presents a U-shaped profile.

Figure 23:
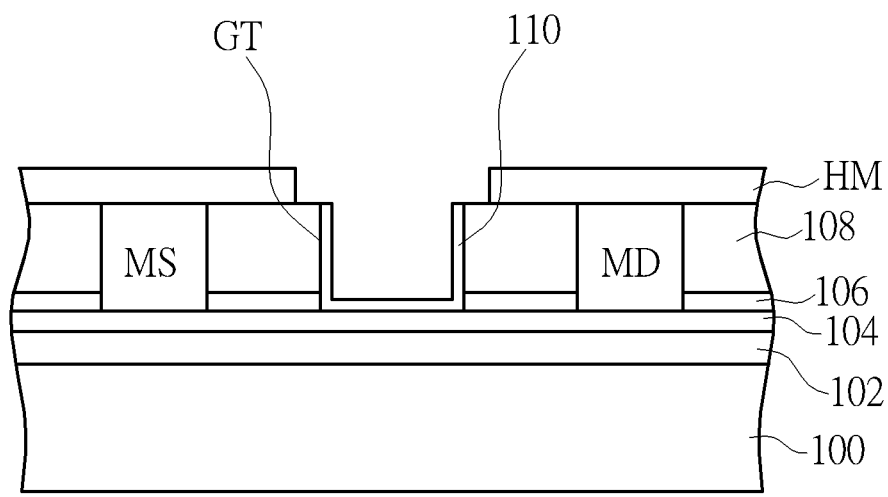

As shown in FIG. 23, a wet etching process, such as a hydrochloric acid solution, is used to completely remove the metal layer CM in the gate trench GT, leaving the second graphene layer 110 in the gate trench GT intact. Since the metal layer CM is removed by the wet etching process, the second graphene layer 110 will not be damaged.

Figure 24:
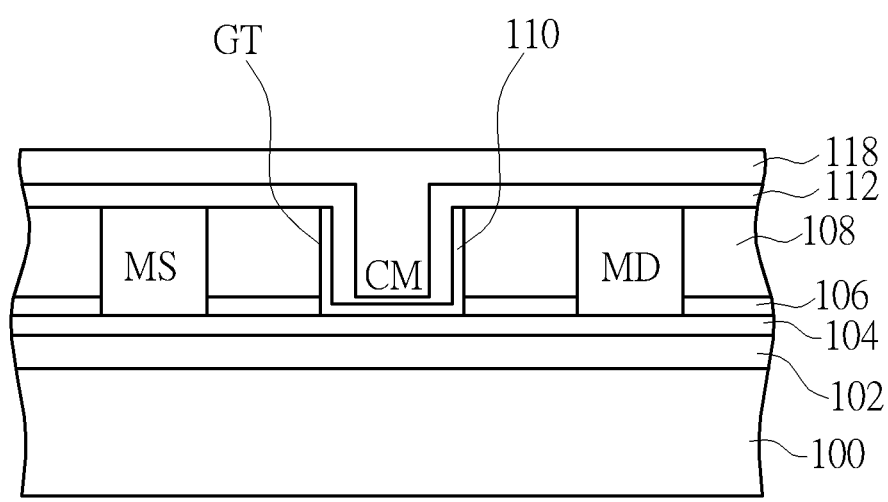

Subsequently, as shown in FIG. 24, the hard mask HM is selectively removed. A gate dielectric layer 112 is then formed on the second graphene layer 110 and the first interlayer dielectric layer 108. A gate metal layer 118 is then formed on the gate dielectric layer 112. According to an embodiment of the present invention, the gate dielectric layer 112 is in direct contact with the upper surface of the first interlayer dielectric layer 108.

Figure 25:
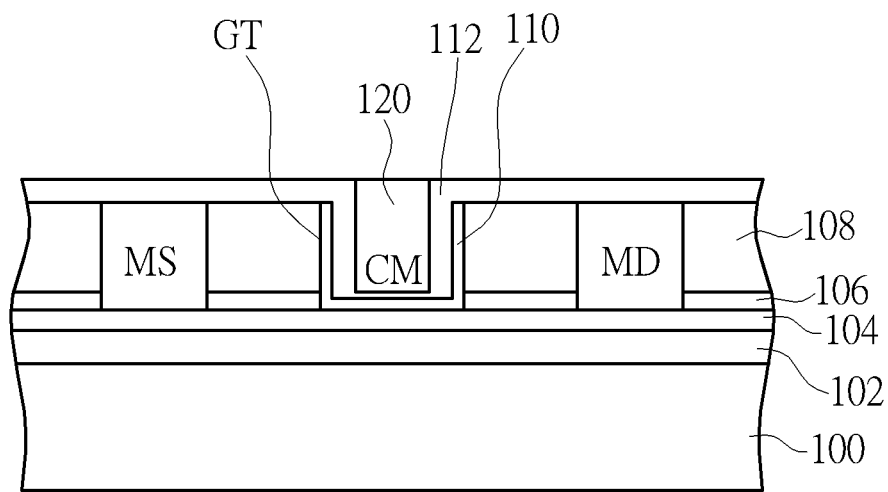

As shown in FIG. 25, next, a planarization process, such as a chemical mechanical polishing process, is performed to remove the gate metal layer 118 outside the gate trench GT, thereby forming the gate electrode 120 in the gate trench GT.

Figure 26:
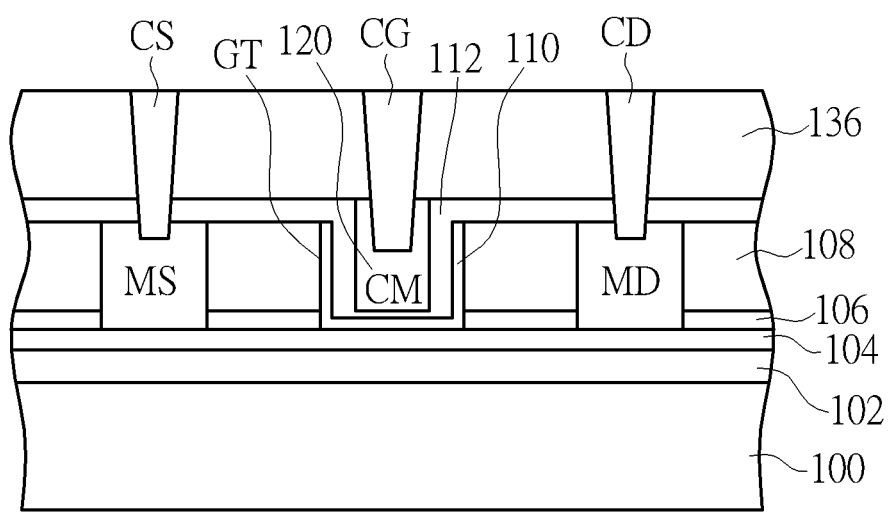

As shown in FIG. 26, a second interlayer dielectric layer 136 is deposited in a blanket manner. A gate contact CG in direct contact with the gate electrode 120, a source contact CS in direct contact with the source metal layer MS, and a drain contact CD in direct contact with the drain metal layer MD are formed in the second interlayer dielectric layer 136.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A field effect transistor, comprising:
   a substrate having a transistor forming region thereon;
   an insulating layer on the substrate;
   a first graphene layer on the insulating layer within the transistor forming region;
   an etch stop layer on the first graphene layer within the transistor forming region;
   a first inter-layer dielectric layer on the etch stop layer;
   a gate trench recessed into the first inter-layer dielectric layer and the etch stop layer within the transistor forming region;
   a second graphene layer on interior surface of the gate trench;
   a gate dielectric layer on the second graphene layer and on the first inter-layer dielectric layer; and
   a gate electrode on the gate dielectric layer within the gate trench.

2. The field effect transistor according to claim 1, wherein the second graphene layer is in direct contact with the first graphene layer within the gate trench.

3. The field effect transistor according to claim 1, wherein the insulating layer comprises a silicon oxide layer.

4. The field effect transistor according to claim 1, wherein the etch stop layer comprises a silicon nitride layer.

5. The field effect transistor according to claim 1 further comprising:
   a source metal layer embedded in the first inter-layer dielectric layer and the etch stop layer, on a side of the gate electrode; and
   a drain metal layer embedded in the first inter-layer dielectric layer and the etch stop layer, on an opposite side of the gate electrode, wherein the source metal layer and the drain metal layer are in direct contact with the first graphene layer.

6. The field effect transistor according to claim 5 further comprising:

a second inter-layer dielectric layer covering the gate dielectric layer, the gate electrode, the source metal layer, and the drain metal layer.

7. The field effect transistor according to claim 6 further comprising:
   a gate contact embedded in the second inter-layer dielectric layer and in direct contact with the gate electrode;
   a source contact embedded in the second inter-layer dielectric layer and in direct contact with the source metal layer; and
   a drain contact embedded in the second inter-layer dielectric layer and in direct contact with the drain metal layer.

8. The field effect transistor according to claim 6, wherein the gate dielectric layer is in direct contact with the second inter-layer dielectric layer.

9. The field effect transistor according to claim 1, wherein the gate dielectric layer is in direct contact with the first inter-layer dielectric layer.

10. The field effect transistor according to claim 1, wherein the first graphene layer comprises single-layer graphene, and the second graphene layer comprises single-layer or double-layer graphene.

11. A method for fabricating a field effect transistor, comprising:
    providing a substrate having a transistor forming region thereon;
    forming an insulating layer on the substrate;
    forming a first graphene layer on the insulating layer within the transistor forming region;
    forming an etch stop layer on the first graphene layer within the transistor forming region;
    forming a first inter-layer dielectric layer on the etch stop layer;
    forming a gate trench recessed into the first inter-layer dielectric layer and the etch stop layer within the transistor forming region;
    forming a second graphene layer on interior surface of the gate trench;
    forming a gate dielectric layer on the second graphene layer and on the first inter-layer dielectric layer; and
    forming a gate electrode on the gate dielectric layer within the gate trench.

12. The method according to claim 11, wherein the second graphene layer is in direct contact with the first graphene layer within the gate trench.

13. The method according to claim 11, wherein the insulating layer comprises a silicon oxide layer.

14. The method according to claim 11, wherein the etch stop layer comprises a silicon nitride layer.

15. The method according to claim 11 further comprising:
    forming a source metal layer in the first inter-layer dielectric layer and the etch stop layer, on a side of the gate electrode; and
    forming a drain metal layer in the first inter-layer dielectric layer and the etch stop layer, on an opposite side of the gate electrode, wherein the source metal layer and the drain metal layer are in direct contact with the first graphene layer.

16. The method according to claim 15 further comprising:
    forming a second inter-layer dielectric layer covering the gate dielectric layer, the gate electrode, the source metal layer, and the drain metal layer.

17. The method according to claim 16 further comprising:
    forming a gate contact in the second inter-layer dielectric layer, wherein the gate contact is in direct contact with the gate electrode;

forming a source contact in the second inter-layer dielectric layer, wherein the source contact is in direct contact with the source metal layer; and forming a drain contact in the second inter-layer dielectric layer, wherein the drain contact is in direct contact with the drain metal layer.

18. The method according to claim 16, wherein the gate dielectric layer is in direct contact with the second inter-layer dielectric layer.

19. The method according to claim 11, wherein the gate dielectric layer is in direct contact with the first inter-layer dielectric layer.

20. The method according to claim 11, wherein the first graphene layer comprises single-layer graphene, and the second graphene layer comprises single-layer or double-layer graphene.

* * * * *